United States Patent [19]

Itou et al.

[11] Patent Number: 5,122,674
[45] Date of Patent: Jun. 16, 1992

[54] SEMICONDUCTOR SWITCHING APPARATUS

[75] Inventors: Hiroshi Itou; Akihiko Iwata; Tatsuki Okamoto; Yoshihiro Ueda; Shinji Murata; Takashi Kumagai; Yoichiro Tabata, all of Amagasaki, Japan

[73] Assignee: Mitsubishi Denki Kabushiki Kaisha, Tokyo, Japan

[21] Appl. No.: 621,999

[22] Filed: Dec. 4, 1990

[30] Foreign Application Priority Data

Dec. 4, 1989 [JP] Japan .................................. 1-314568
Jan. 31, 1990 [JP] Japan .................................. 2-20680

[51] Int. Cl.$^5$ ............................................... H05K 1/14
[52] U.S. Cl. ............................ 307/108; 307/113; 307/242; 361/398; 361/419
[58] Field of Search ............ 361/331, 332, 334, 388 X, 361/392-394, 398 X, 402, 417, 419 X, 420; 340/825.89, 825.91, 825.93; 307/112, 113 X, 106, 108, 241, 242 X, 304, 571

[56] References Cited

U.S. PATENT DOCUMENTS

| 4,287,432 | 9/1981 | Sensibar ........................ 307/116 |
| 4,399,488 | 8/1983 | Ruwe ............................ 361/412 |
| 4,727,262 | 2/1988 | O'Loughflin .................. 307/106 |
| 4,833,568 | 5/1989 | Berhold ........................ 361/383 |
| 4,935,839 | 6/1990 | Lockwood .................... 361/230 |

FOREIGN PATENT DOCUMENTS

WO86/01031  2/1986  PCT Int'l Appl. .

OTHER PUBLICATIONS

Rev. Sci, Instrum. 56 (11), Nov. 1985, pp. 2018-2020, T. Shimada et al., "An All Solid-State Magnetic Switching Exciter for Pumping Excimer Lasers".
Sov. J. Quantum Electron, 11 (1), Jan. 1981, pp. 111-112, V. M. Aleksandrov et al., "Multichannel Semiconductor Nanosecond Switch for Excitation of Copper Vapor by a Transverse Discharge".
Applied Physics Letters, vol. 29, No. 4, Aug. 15, 1976, pp. 261-263, O. S. Zucker et al., "Experimental Demonstration of High-Power Fast-Rise-Time Switching in Silicon Junction Semiconductors".
Electronic Engineering, vol. 57, No. 698, pp. 67-70, K. Gauen, "High Power Multiple Die Mosfet Circuits".
Jee Journal of Electronic Engineering, vol. 26, No. 276, pp. 82-88 "Semiconductor Pulse-Controlled Power Source Leads Fast, Long Life".
Instruments & Experimental Techniques, vol. 25, No. 4, part 1, pp. 886-888, V. I. Amelichkin, et al., "A High Pulsed Thyristor Switch".

Primary Examiner—Gerald P. Tolin
Attorney, Agent, or Firm—Oblon, Spivak, McClelland, Maier & Neustadt

[57] ABSTRACT

In a pulse generator circuit for a laser unit etc., plural semiconductor switches arranged in matrix alignment on an outer surface of a first tube are connected in series and parallel with one another, and an end of each series-connection of the semiconductor switches is electrically connected to a second tube provided in coaxial alignment to the first tube, thereby realizing a synthetic semiconductor switch for switching high voltage and large current between the other end of the series-connection of the semiconductor switches and the second tube.

5 Claims, 14 Drawing Sheets

FIG.13(a) $I_x$ 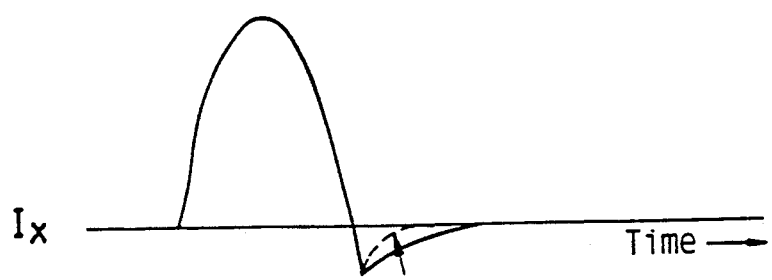
FIG.13(b) $V_d$ 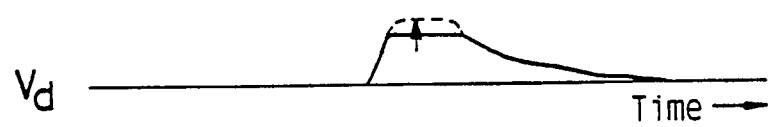
FIG.13(c) $V_b$ 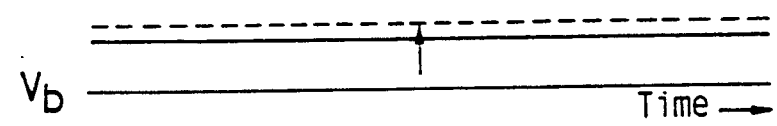
FIG.14
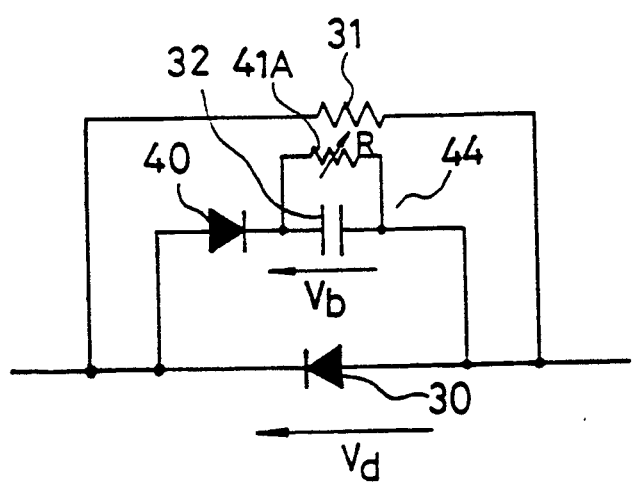

5,122,674

SEMICONDUCTOR SWITCHING APPARATUS

FIELD OF THE INVENTION AND RELATED ART STATEMENT

1. Field of the Invention

The present invention relates to a semiconductor switching apparatus and more particularly to a semiconductor switching apparatus for switching high-voltage and large-current, such as a switch for a pulsed laser unit.

2. Description of the Related Art

FIG. 17 is a circuit diagram showing a conventional pulse generator circuit for a copper vapor laser which is disclosed, for example, in "COPPER VAPOR LASERS COME OF AGE" of LASER FOCUS (July, 1982).

In FIG. 17, a D.C. high voltage source 1 generates a D.C. high voltage (from several kilovolts to tens of kilovolts). A capacitor 4 is thereby charged with current through a reactor 2, a diode 3 and a resistor 5. Thereafter, when a Thyratron switch 6 turns on, electric charge stored in the capacitor 4 is supplied to a laser tube (discharge tube) 7 through the thyratron switch 6. Discharge is thereby initiated in the laser tube 7, and a metal such as copper included in the laser tube 7 is heated and vaporized. At that time, since an impedance of the laser tube 7 is made very much smaller than a resistance of the resistor 5, current flows mainly through the laser tube 7. The laser tube 7 is thereby excited and generates laser oscillation.

In the above-mentioned pulse generator circuit, it is necessary to impress the laser tube 7 with a very sharp-shaped pulse voltage in order to obtain a laser output as high as possible. Accordingly, the thyratron switch 6 is required to have a very fast and large power switching ability of tens of nanoseconds to turn itself on from off.

However, since the above-mentioned thyratron switch 6 is a kind of vacuum tube, its lifetime is comparatively short. It is therefore needed to often replace the thyratron switch 6. Furthermore, since the thryratron switch 6 is a handmade good, each has individual characteristics in rise-up of current and in a switching time, which affects an efficiency of the laser. Therefore, when the thyratron switch 6 is exchanged for new one, the above-mentioned characteristics is changed as a result.

As mentioned above, the conventional pulse generator circuit lacks stability in quality, resulting in low reliability.

OBJECT AND SUMMARY OF THE INVENTION

An object of the present invention is to offer a semiconductor switching apparatus which can be employed in a pulse generator circuit and which has an excellent and stable switching characteristics for a semi-permanent period.

In order to achieve the above-mentioned object, the semiconductor switching apparatus of the present invention comprises:

a first tube;
a plurality of semiconductor switches which are provided on the first tube and are electrically connected in series and parallel with one another; and
a second tube which is provided in substantially coaxial alignment to the first tube and is electrically connected to an end of a series-connection of the semiconductor switches, the second tube being of conductive material.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 13 (a), FIG. 13 (b) and FIG. 12 (c) are graphs showing waveforms of a current $I_x$, a voltage $V_d$ and a voltage $V_b$ in FIG. 12, respectively.

FIG. 14 is a circuit diagram showing a modified embodiment of a partial circuit in FIG. 12.

It will be recognized that some or all of the Figures are schematic representations for purposes of illustration and do not necessarily depict the actual relative sizes or locations of the elements shown.

DESCRIPTION OF THE PREFERRED EMBODIMENTS

Hereafter, preferred embodiments of the present invention are described with reference to the accompanying drawings.

Figure 1:
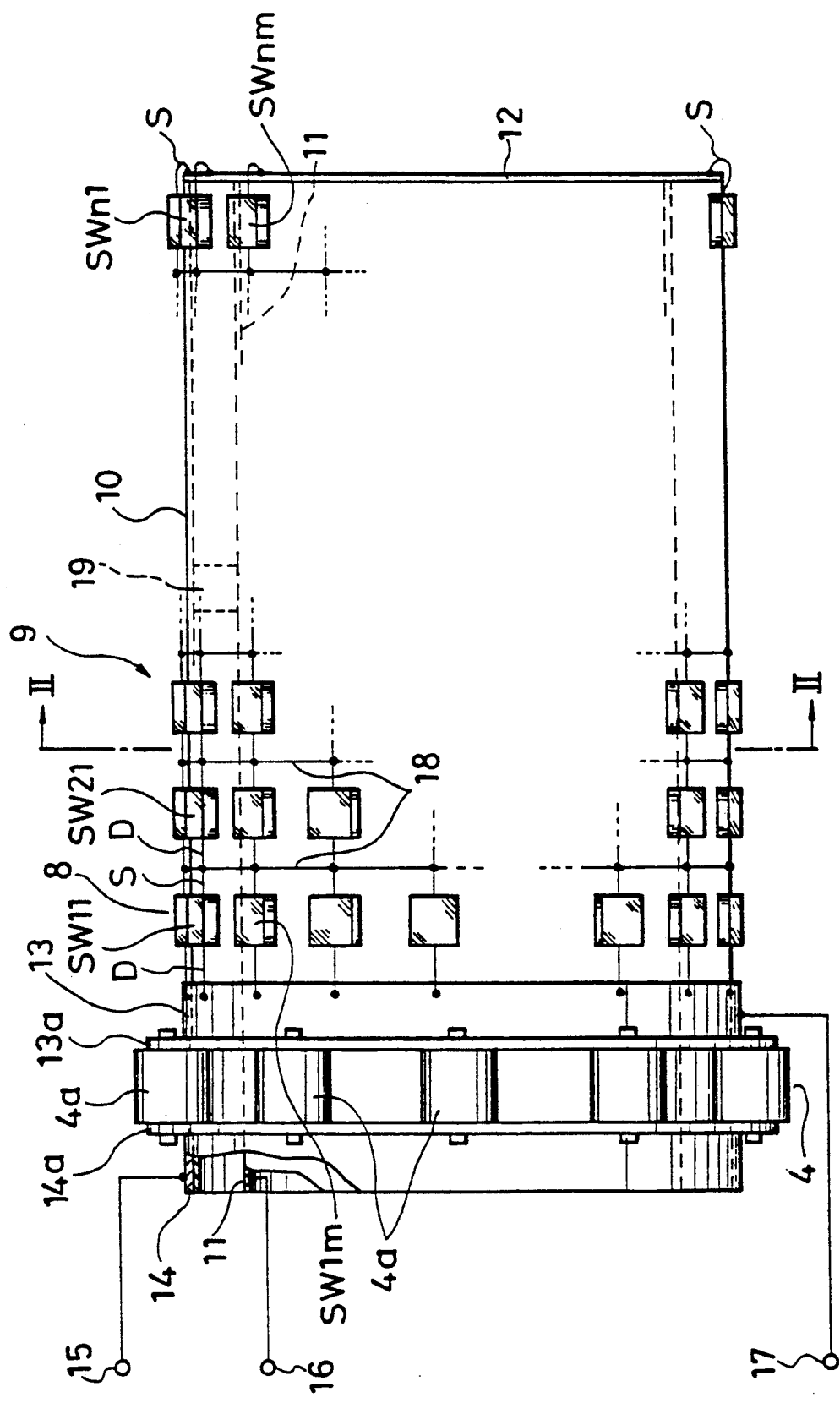
FIG. 1 is a front view showing a semiconductor switching apparatus of a first embodiment of the present invention.
Figure 2:
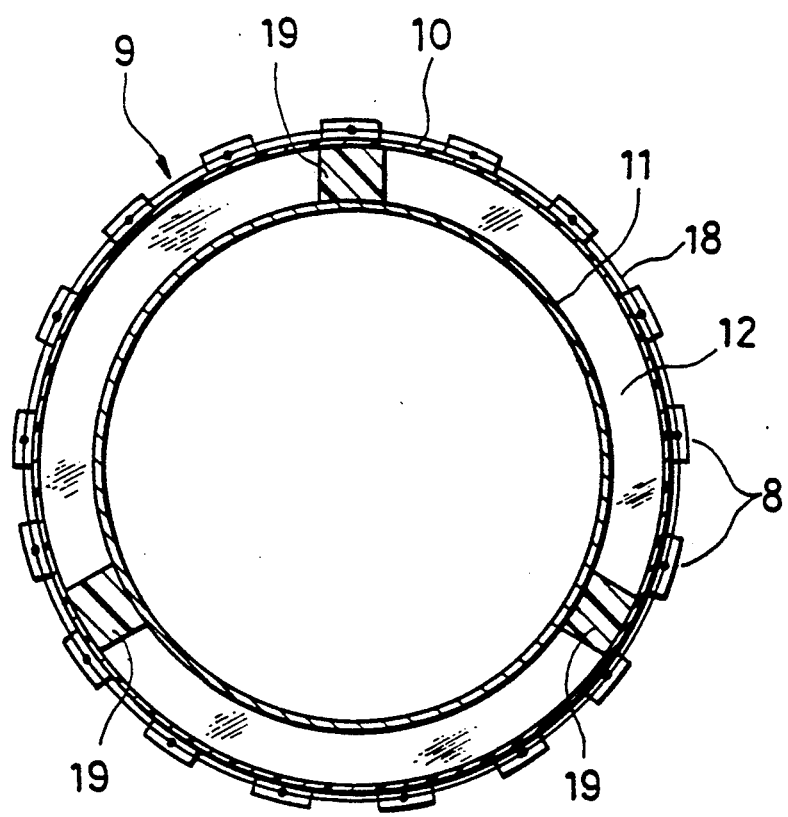
FIG. 2 is a cross-sectional side view taken on line II—II in FIG. 1.
Figure 3:
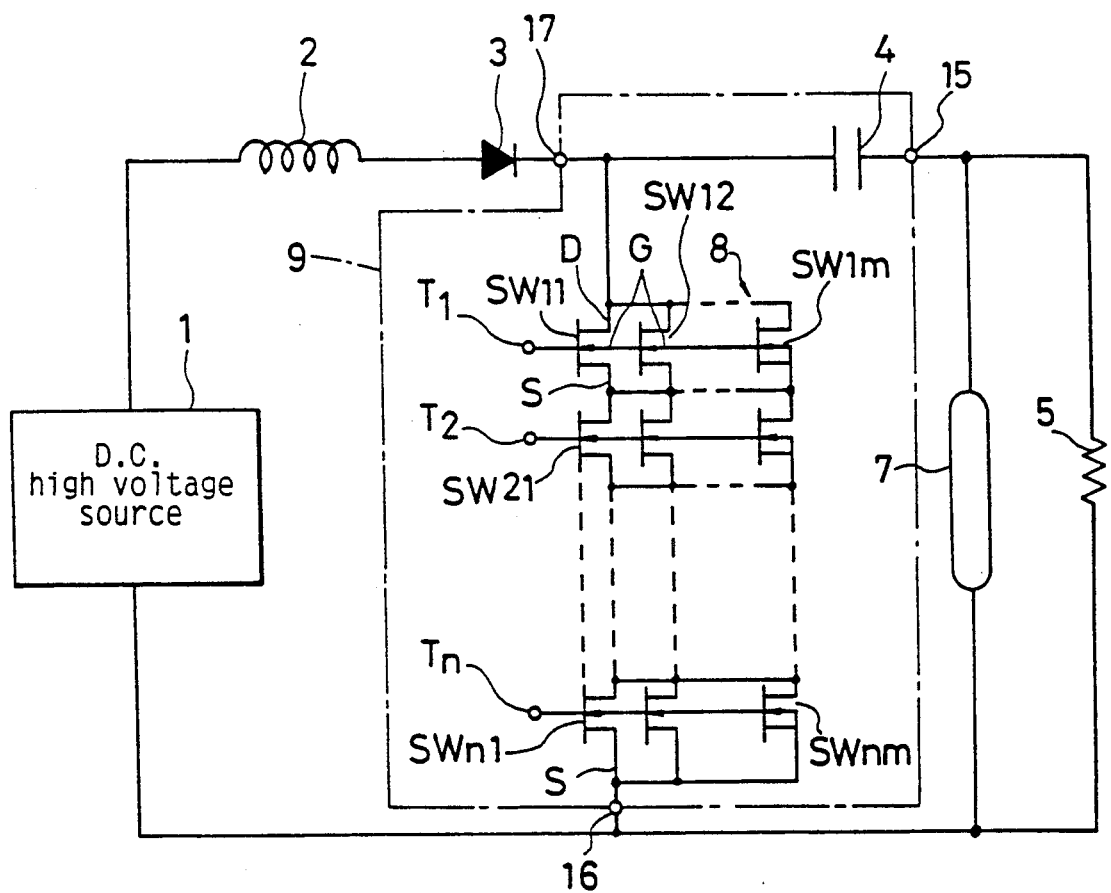
FIG. 3 is a circuit diagram showing a pulse generator circuit including the semiconductor switching apparatus of the present invention.

FIGS. 1–3 are concerned with a first embodiment of the present invention. FIG. 3 is a circuit diagram showing a pulse generator circuit including a semiconductor switching apparatus 9. In FIG. 3, the semiconductor switching apparatus 9 consists of a synthetic semiconductor switch 8 (described later) and a capacitor 4 and has three terminals 15, 16 and 17. A reactor 2 and a diode 3 are connected to a positive end of a D.C. high voltage source 1, and the terminal 17 of the semiconductor switching apparatus 9 is connected to a cathode of the diode 3. The terminal 16 of the semiconductor switching apparatus 9 is connected to a negative end of the D.C. high voltage source 1. A laser tube (discharge tube) 7, to which a resistor 5 is connected in parallel, is connected between two terminals 15 and 16 of the semiconductor switching apparatus 9.

The D.C. high voltage source 1 generates a D.C. high voltage (from several kilovolt to tens of kilovolts). The capacitor 4 is thereby charged with current through the reactor 2, the diode 3 and the resistor 5. After that, when the synthetic semiconductor switch 8 turns on, electric charge stored in the capacitor 4 is supplied to the laser tube 7 through the synthetic semiconductor switch 8. Discharge is thereby initiated in the laser tube 7, and a metal such as copper included in the laser tube 7 is heated and vaporized. At that time, since an impedance of the laser tube 7 is made very much smaller than a resistance of the resistor 5, current flows mainly through the laser tube 7. The laser tube 7 is thereby excited and generates laser oscillation.

The above-mentioned synthetic semiconductor switch 8 consists of plural semiconductor switches SW11,-, SWnm which are connected in series and parallel with one another. In this embodiment, an FET(-Field Effect Transistor) is employed for each of the semiconductor switches. In FIG. 3, n pieces of the FET SW11-SWn1 (n: integer) are connected in series with one another in a manner so that each drain terminal is connected to a source terminal of an adjacent FET. Further, m pieces of the FET SW11-SW1m (m: integer) are connected in parallel with one another. In the similar way, respective m pieces of FET SW21-SW2m, -, SWn1-SWnm are connected in parallel with one another. As a result, m×n pieces of FET SW11, -, SWnm are connected in series and parallel with one another, thereby forming a connection having a grid pattern. Gate terminals G of each m pieces of the FET SW11-SW1m, -, SWn1-SWnm are connected commonly to terminals T1, -, Tn, respectively.

Next, construction of the semiconductor switching apparatus 9 is described. FIG. 1 is a front view showing the semiconductor switching apparatus 9, and FIG. 2 is a side view of the semiconductor switching apparatus 9 taken on line II—II in FIG. 1.

In FIG. 1 or FIG. 2, a cylindrical outer tube (a first tube) 10 is made of insulating material, such as ceramic. A cylindrical inner tube (a second tube) 11, which is made of conductive material, is provided in coaxial alignment with outer tube 10 via spacers 19. The right end of the outer tube 10 and the right end of the inner tube 11 are electrically connected to each other via an annular short-circuit ring 12 of conductive material. A pair of support rings 13 and 14, which are made of conductive material such as copper, are fitted on and around the outer tube 10 so that flange portions 13a and 14a of the respective support rings 13 and 14 are disposed to hold and electrically put plural capacitors 4a therebetween. These capacitors 4a are thus connected in parallel with one another, thereby constituting the capacitor 4 of large capacitance as a whole. Potentials generated on the support rings 13, 14 and the inner tube 11 are led to the terminals 17, 15 and 16, respectively.

On the outer surface of the outer tube 1, plural FETs SW11, -, SWnm are fixed in a substantially matrix alignment and are electrically connected in series and parallel with one another. Along the axial direction of the outer tube 10, n pieces of the FET SW1m, -, SWnm are sequentially connected in series with adjacent ones. Each drain terminal D of the left end FET (e.g. SW1m) is connected to the support ring 13, and each source terminal S of the right end FET (e.g. SWnm) is connected to the short-circuit ring 12. Connection points between the respective drain terminals D and the adjacent source terminals S are connected by plural (n-1) lead wires 18 which are provided in the circumferential direction of the outer tube 10. The gate terminals and the wiring therefor are omitted in FIGS. 1 and 2 for simplicity and clarity of illustration.

Hereupon, the grounds of our employment of the above-mentioned synthetic semiconductor switch 8 is described. A semiconductor switch such as a FET has generally a semi-permanent lifetime and is stable in operation. However, there has not been developed hitherto a semiconductor device which can realize the switching at a voltage range from several kilovolts to tens of kilovolts within tens of nanoseconds. It is therefore impossible to replace the conventional thyratron switch with a single semiconductor switch. The FET, which is capable of switching in tens of nanoseconds, has a withstand voltage of at most about 1 kilovolt. In order to realize the withstand voltage of several to tens kilovolts by the FET, it is necessary to connect plural FETs in series with one another. Furthermore, since current capacity of one FET is comparatively small, it is also necessary to make each of the series-connected FETs into plural FETs which are connected in parallel with one another. As a result, plural FETs SW11-SWnm are aligned in the matrix pattern and are connected in series and parallel with one another to form the grid-pattern connection.

In general, it is difficult to get a balanced current distribution among the plural FETs connected in parallel with one another. However, in such a very short switching time (e.g. tens of nanoseconds) as required for the copper vapor laser unit, distribution of current is determined by couter-electromotive force of each inductance induced by geometrical configuration of the semiconductor switching apparatus 9 rather than by ON-state voltage based on inherent characteristics of the FET. This is because the inductance is very much larger than a resistance of each FET in the ON-state because of a very high frequency component contained in the very short pulse.

In the above-mentioned embodiment, the outer tube 10 on which plural FETs SW11, -, SWnm connected in series and parallel with one another are provided, and the inner tube 11 are disposed in coaxial alignment. Further, the inner tube 11 acts as a common return line for the plural FETs SW11, -, SWnm. Therefore, inductances seen from the respective FETs SW11, -, SWnm are substantially equal to one another. As a result, the current equally branches out into the FETs connected in parallel with one another, thereby realizing an excellent switching characteristics as a whole.

Figure 4:
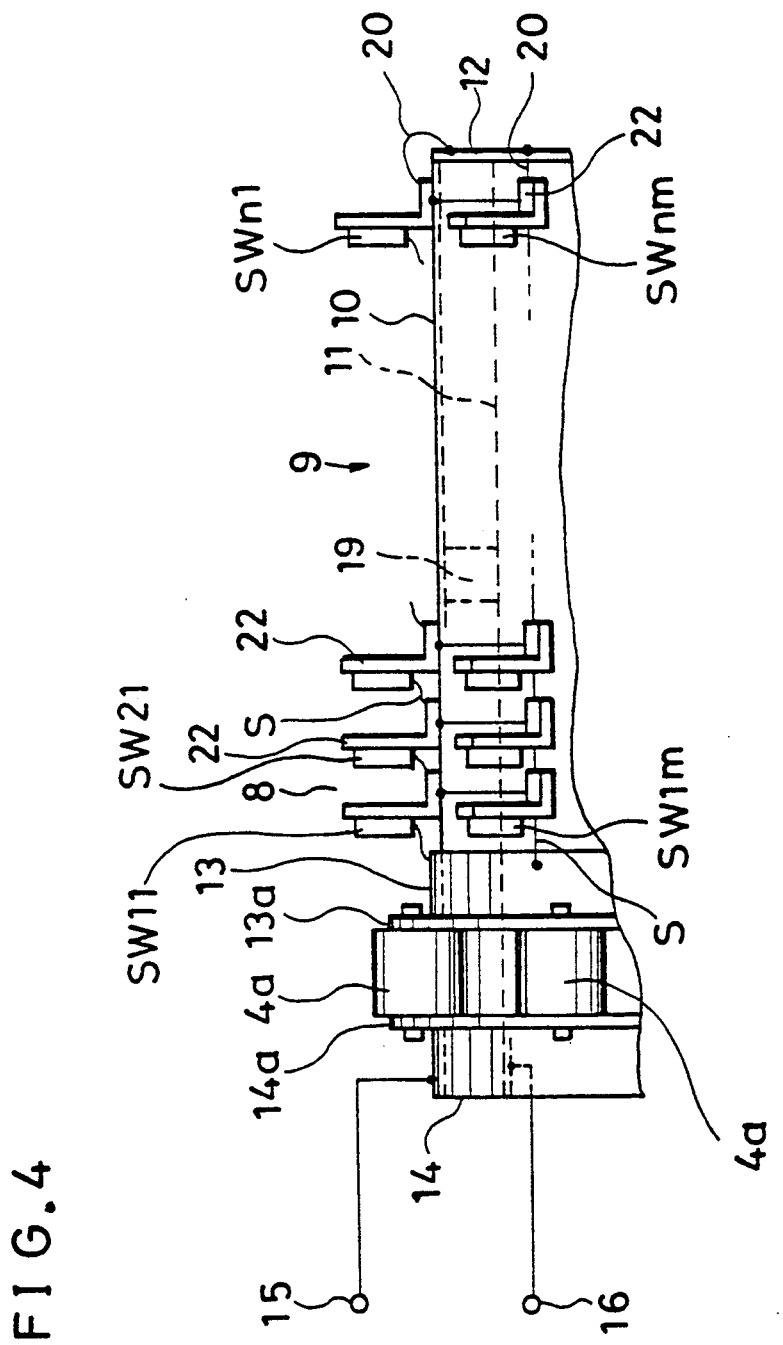
FIG. 4 is a front view showing a part of the semiconductor switching apparatus of a second embodiment of the present invention.

FIG. 4 is a front view showing a part of the semiconductor switching apparatus of a second embodiment. Corresponding parts and components to the first embodiment are shown by the same numerals and marks, and the description thereon made in the first embodiment similarly applies. Differences and features of this second embodiment from the first embodiment are as follows.

In FIG. 4, each of the plural FETs SW11, -, SWnm is fixed onto an "L"-shaped metal fittings 22, and this metal fitting 22 is fixed on the outer tube 10. Each drain terminal (not shown) of the FETs SW11, -, SWnm is directly connected to the metal fittings 22, and each source terminal S of the adjacent FET is connected to the metal fittings 22. A source terminal S of the left end FET SW1m is connected to the support ring 13, and the metal fittings 22 of the right end FET SWnm is electrically connected to the short-circuit ring 12 via a lead wire 20. According to this construction, the FETs SW11, -, SWnm are held in the radial direction of the outer tube 10, thereby shortening both the tubes 10 and 11 in their axial direction in comparison with those of the first embodiment.

Figure 5:
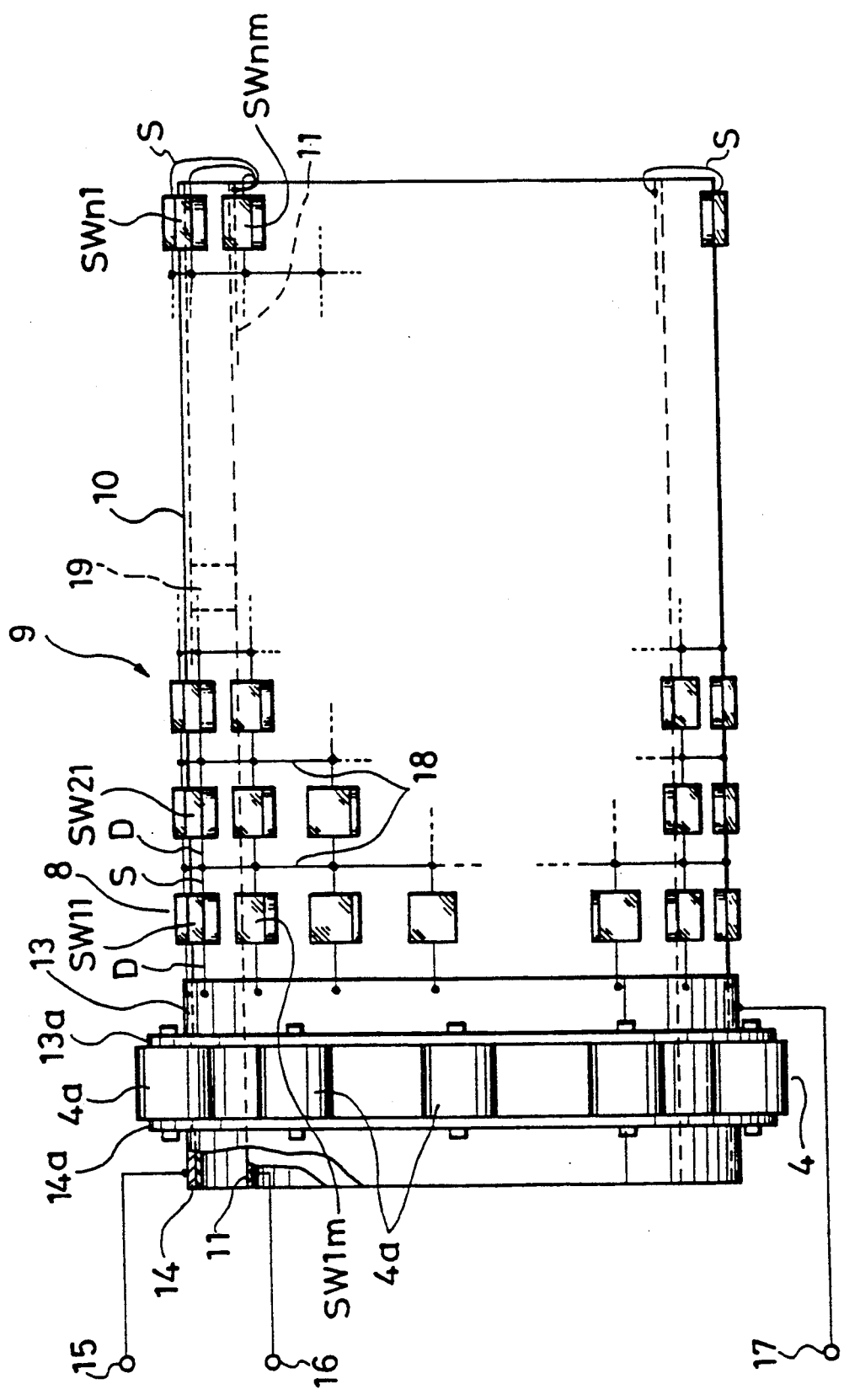
FIG. 5 is a front view showing the semiconductor switching apparatus of a third embodiment of the present invention.

FIG. 5 is a front view showing a semiconductor switching apparatus of a third embodiment. Corresponding parts and components to the first embodiment are shown by the same numerals and marks, and the description thereon made in the first embodiment similarly applies. Differences and features of this third embodiment from the first embodiment are as follows. In FIG. 5, a source terminal of each right end FET SWnm is connected directly to the inner tube 11. Therefore, the short-circuit ring 12 such as shown in FIG. 1 is not necessary in a construction of this third embodiment.

Figure 6:
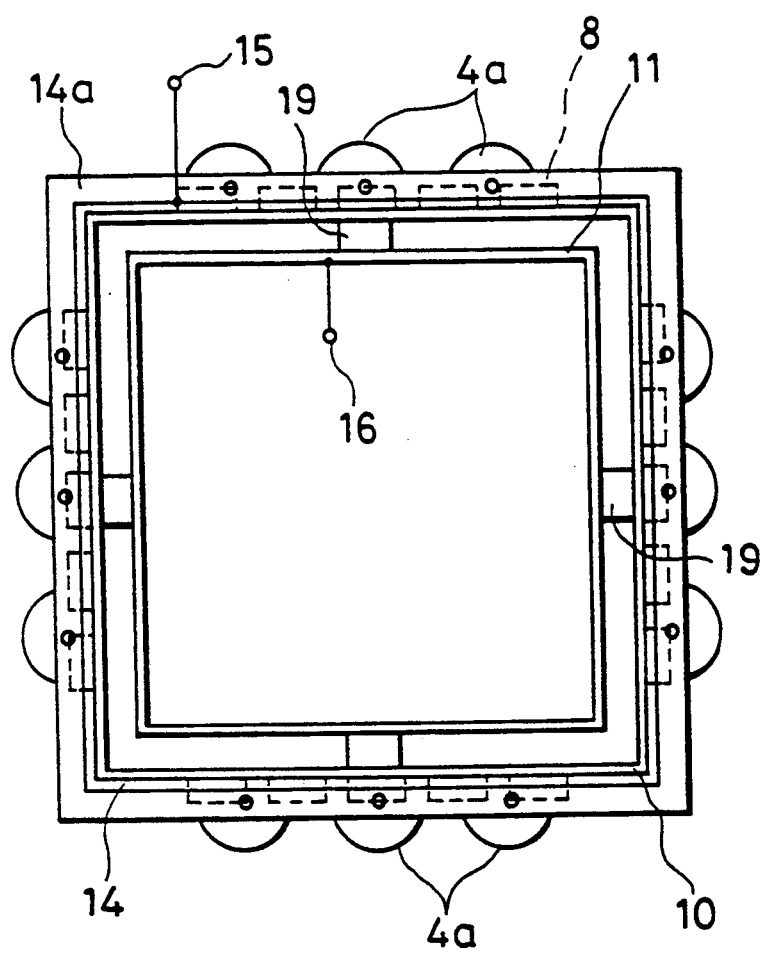
FIG. 6 is a side view showing the semiconductor switching apparatus of a fourth embodiment of the present invention.

Apart from the above-mentioned three embodiments wherein both the outer tube 10 and the inner tube 11 are cylindrical, another embodiment (fourth embodiment) may be such that both the tubes 10 and 11 are square, a side view of which is shown in FIG. 6. In this construction, the inner tube 11 is also held by the spacers 19 in coaxial alignment to the outer tube 10. Other corresponding parts to the first embodiment are shown by the same numerals and marks, and the description thereon made in the first embodiment similarly applies.

Figure 7:
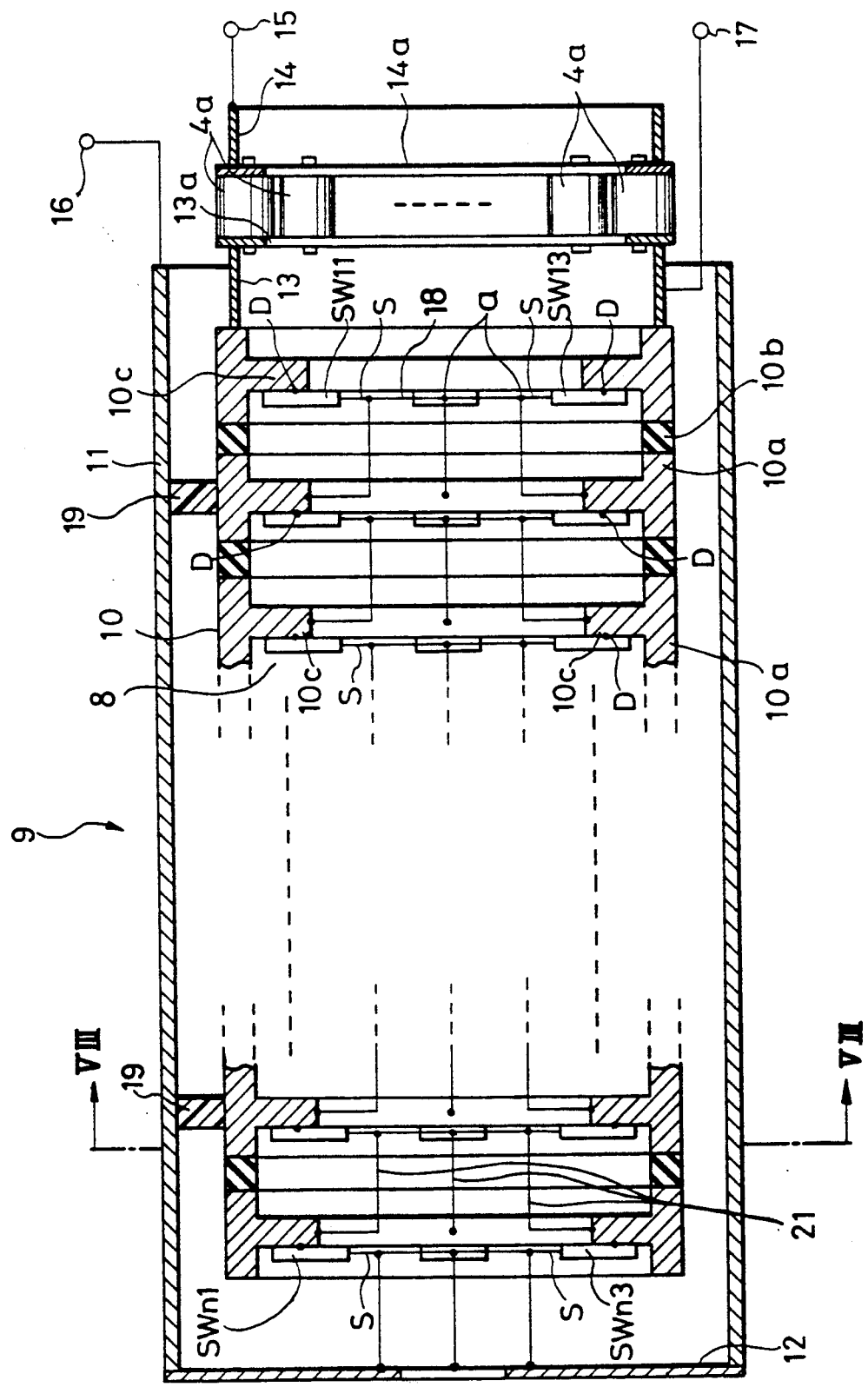
FIG. 7 is a cross-sectional front view showing the semiconductor switching apparatus of a fifth embodiment of the present invention.
Figure 8:
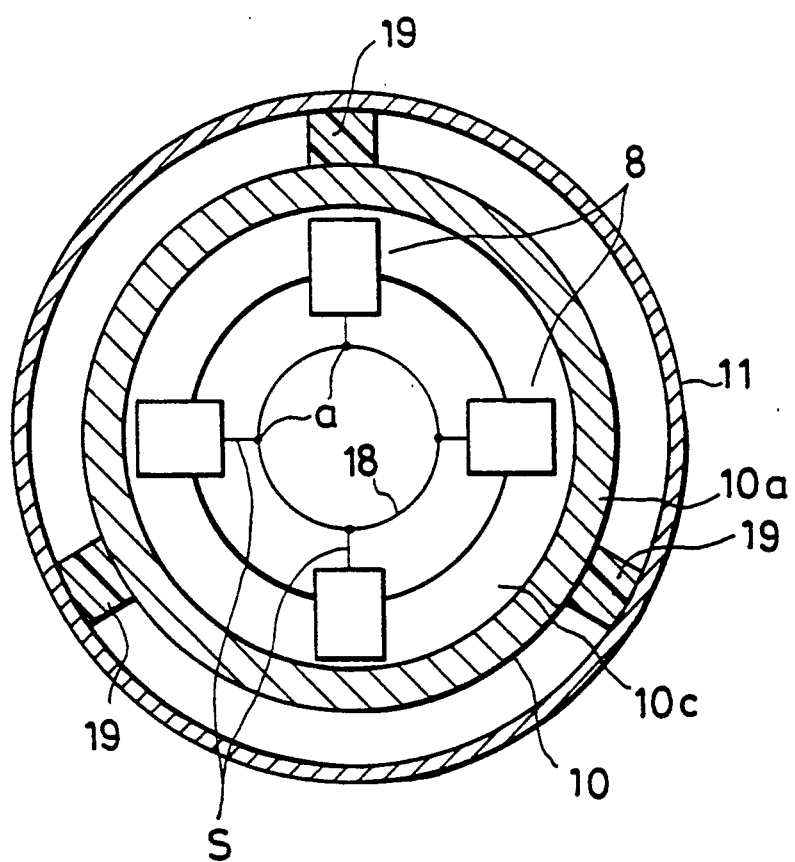
FIG. 8 is a cross-sectional side view taken on line VIII—VIII in FIG. 7.

FIG. 7 is a cross-sectional front view showing a semiconductor switching apparatus of a fifth embodiment, and FIG. 8 is a cross-sectional side view taken on line VIII—VIII of FIG. 7. Corresponding parts and components to the first embodiment are shown by the same numerals and marks, and the description thereon made in the first embodiment similarly applies. Differences and features of this fifth embodiment from the first embodiment are as follows. In FIG. 7, cylindrical first tube 10 is provided inside the cylindrical second tube 11 in coaxial aligment to each other via the spacers 19. The second tube 11 is made of conductive material, and the first tube 11 consists of plural conductive rings 10a and plural insulating rings 10b. Each of the insulating rings 10b is fixed between two conductive rings 10a by screws (not shown) or the like. Each of the conductive rings 10a has a heat radiation fin 10c which is integrally formed with the conductive ring 10a so as to project radially inward as shown in FIG. 8. Each of the FETs SW11, -, SWn4 is fixed on the heat radiation fin 10c, and the drain terminal D is connected directly to the heat radiation fin 10c. The support ring 13 is fixed to the right end conductive ring 10a. Each one end of the plural capacitors 4a is fixed and electrically connected to the flange 13a of the support ring 13, and the other end is fixed and electrically connected to the flange 14a of the support ring 14. The flange 13a of the support ring 13, the plural capacitors 4a and the support ring 14 are projected out of the second tube 11 in the axial direction.

Along the axial direction of the first tube 10, n pieces of FET are electrically connected in series with one another, plural (e.g. 4) arrays of these series-connected FETs are arranged in parallel with one another by every predetermined angle (e.g. 90°) in the circumferential direction as shown in FIG. 8. Each drain terminal D of the right end FETs (e.g. SW11) is connected to the support ring 13 via the right end conductive ring 10a, and each source terminal S of the left end FET (e.g. SWn1) is connected to the short-circuit ring 12 which is fixed to the left end of the second tube 11. Further, each of the heat radiation fins 10c is electrically connected by plural (e.g. four) wires 21 (FIG. 7) to connection points "a" where each of four source terminals S is connected in common by a wire 18 (FIG. 8) provided circularly. Thus, plural (i.e. 4) FETs are connected in parallel with one another at every conductor ring 10a, and n groups of these parallel-connected FETs are connected in series with one another.

In this fifth embodiment, since the first tube 10 is covered with the second tube 11 of the conductive material, shield effect is realized, so that noise does not leak out of the second tube 11.

In the above-mentioned fifth embodiment, the short-circuit ring 12 is not always necessary. That is, the short-circuit ring 12 can be omitted by connecting each source terminal S of the left end FET directly to the second tube 11. Besides, the first and second tubes 10 and 11 may be square in the similar way to that in the fourth embodiment as shown in FIG. 6.

Apart from the above-mentioned embodiments wherein the FET is employed to constitute the synthetic semiconductor switch 8, another semiconductor switch such as SIT, IGBT, SI-thyristor, transistor or thyristor may be used.

Furthermore, the above-mentioned semiconductor switching apparatus is usable for another electric circuit which requires high-voltage and large current switching performance.

Next, embodiments of the pulse generator circuit using the synthetic semiconductor switch are described.

Figure 9:
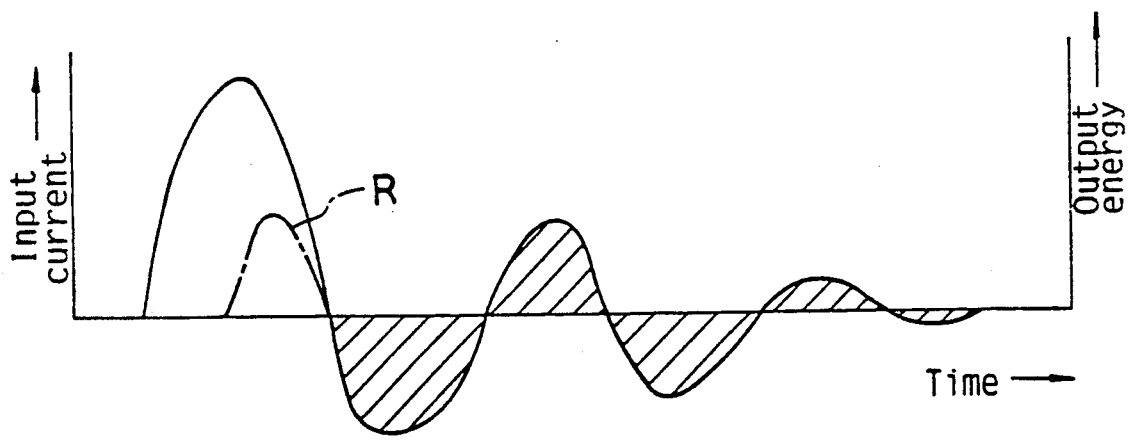
FIG. 9 is a graph showing a waveform of a vibration current and an output waveform of a laser light.

In FIG. 3, when the synthetic semiconductor switch 8 turns on, electric charge stored in the capacitor 4 is supplied to the laser tube 7. At that time, according to the present impedance of the laser tube 7, electric vibration may occur in a discharge pulse circuit including the synthetic semiconductor switch 8, the capacitor 4 and the laser tube 7. By this vibration, vibration current shown by a solid curve in FIG. 9 flows in the laser tube 7. However, the laser light is issued with only a wave R shown by a chain line, the vibration current after issue of the laser light, which is shown by the hatch, does not contribute any more to the laser light oscillation. On the contrary, the vibration current shown by the hatch gives the laser tube 7 an excessive input energy which increases a number of atoms of lower level and results in lowering of efficiency of the laser light oscillation. In order to avoid the above-mentioned lowering of efficiency, preferred embodiments of the pulse generator circuit will be disclosed.

Figure 10:
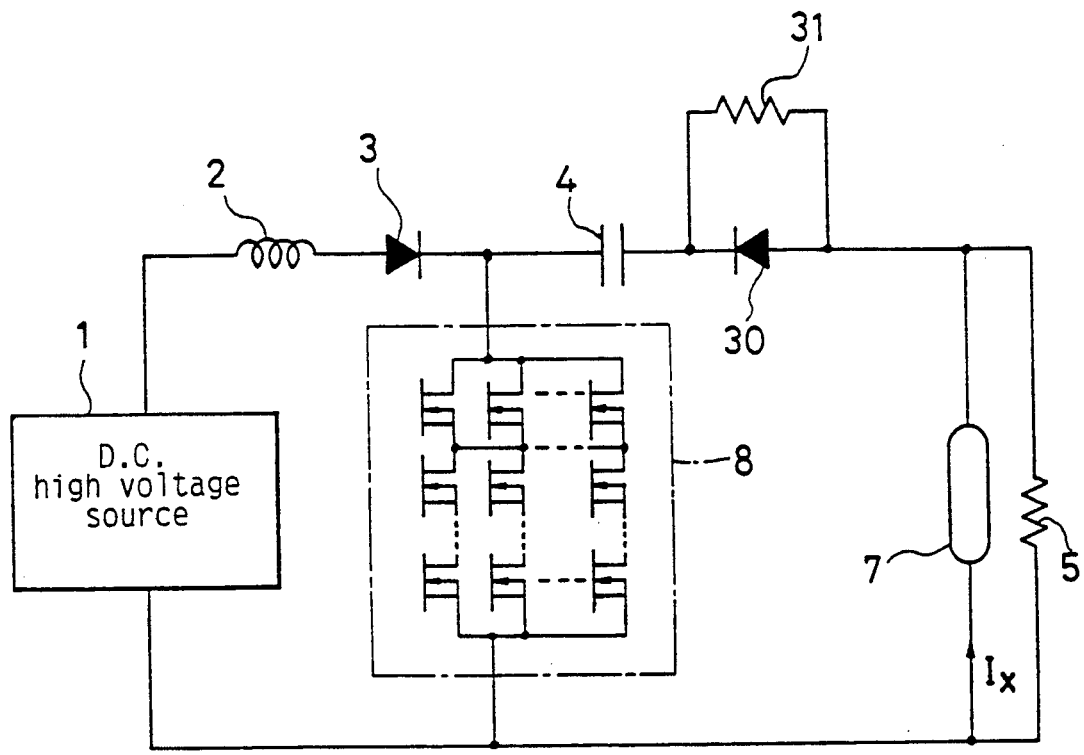
FIG. 10 is a circuit diagram showing the pulse generator circuit of a second embodiment of the present invention.

FIG. 10 is a circuit diagram showing a pulse generator circuit of a second embodiment. Corresponding parts and components to the first embodiment (FIG. 3) are shown by the same numerals and marks, and the description thereon made in the first embodiment similarly applies. Differences and features of this second embodiment from the first embodiment are as follows.

In this embodiment, a diode 30 and a bypass resistor 31 connected in parallel thereto are provided in addition to the pulse generator circuit shown in FIG. 3.

Figure 11:
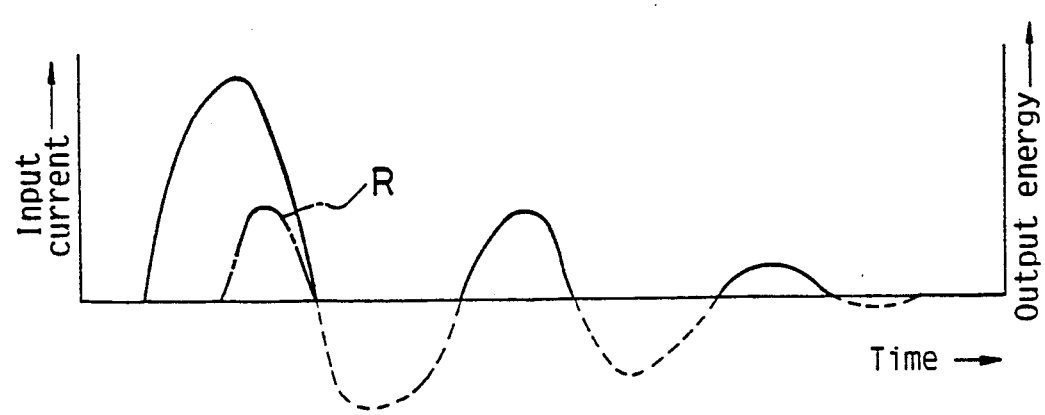
FIG. 11 is a graph showing a waveform of a rectified vibration current and the output waveform of the laser light.

The capacitor 4 is charged with current by the D.C. high voltage source 1 through the reactor 2, the diode 3, the bypass resistor 31 and the resistor 5. When the synthetic semiconductor switch 8 turns on, electric charge stored in the capacitor 4 is supplied to the laser tube 7 through the synthetic semiconductor switch 8 and the diode 30. The laser tube 7 is thereby excited and generates laser oscillation. Even after completion of the laser oscillation, the vibration current shown by a solid and dotted curve in FIG. 11 is still alive in a closed circuit including the laser tube 7. However, negative current (shown by the dotted curve) of the subsequent vibration current is shut off by the diode 30. Input of the unnecessary and excessive vibration current to the laser tube 7 is thereby prevented, and also the efficiency of the laser light oscillation is improved.

Figure 12:
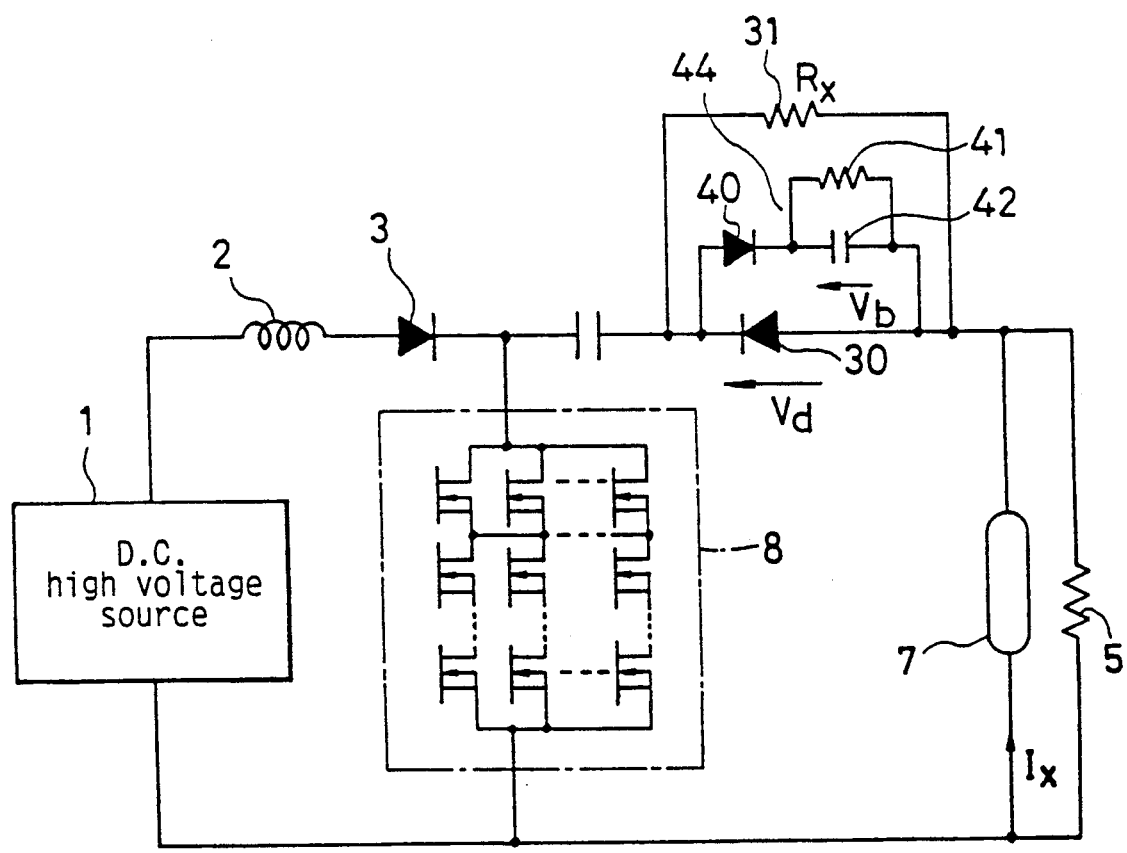
FIG. 12 is a circuit diagram showing the pulse generator circuit of a third embodiment of the present invention.

FIG. 12 is a circuit diagram showing a pulse generator circuit of a third embodiment. Corresponding parts and components to the second embodiment (FIG. 10) are shown by the same numerals and marks, and the description thereon made in the second embodiment similarly applies. Differences and features of this third embodiment from the second embodiment are as follows. In this embodiment, a snubber circuit 44 is provided in addition to the circuit shown by FIG. 10. A capacitor 42 and a diode 40 are connected in series with each other, and its series-connection body is connected in parallel with the diode 30. A resistor 41 is connected in parallel with the capacitor 42.

When the diode 30 acts to inhibit the reverse current, an excessive voltage responding to di/dt is applied across a cathode and an anode of the diode 30. This excessive voltage may cause dielectric breakdown of the diode. However, a snubber circuit 44 consisting of the capacitor 42 and the diode 40 and the resistor 41 serves to protect the diode 30 from the excessive voltage as described in the following.

When the synthetic semiconductor switch 8 turns on, a current $I_x$ shown by FIG. 13(a) flows in the laser tube 7. Immediately after oscillation of the laser, a negative voltage $V_d$ (FIG. 13(b)) is instantaneously applied to both ends of the diode 30. However, this voltage is reduced into a voltage $V_b$ (FIG. 13(c)) by means of the snubber circuit 44, thereby lowering the excessive voltage applied to the diode 30. As a result, dielectric breakdown of the diode 30 is prevented. The voltage $V_d$ lowers in accordance with a time constant which is defined by a capacitance of the capacitor 42 and a resistance of the resistor 41.

In case a variable resistor 41A is employed in place of the fixed resistor 41 as shown in FIG. 14, the reverse current after oscillation of the laser can be set to be a predetermined level by adjusting the variable resistor 41A. The reverse current adjusted properly is utilized to heat the laser tube 7, for instance, at the time when the laser tube is still cold. That is, by adjusting the excessive current flowing in the laser tube 7, optimum waveform of current can be applied to the laser tube 7. When a resistance of the resistor 41A is increased, waveforms of the current $I_x$, the voltage $V_d$ and the voltage $V_b$ are shifted toward directions shown by arrows in FIGS. 13(a), 13(b) and 13(c), thereby resulting in dotted lines, respectively.

Figure 15:
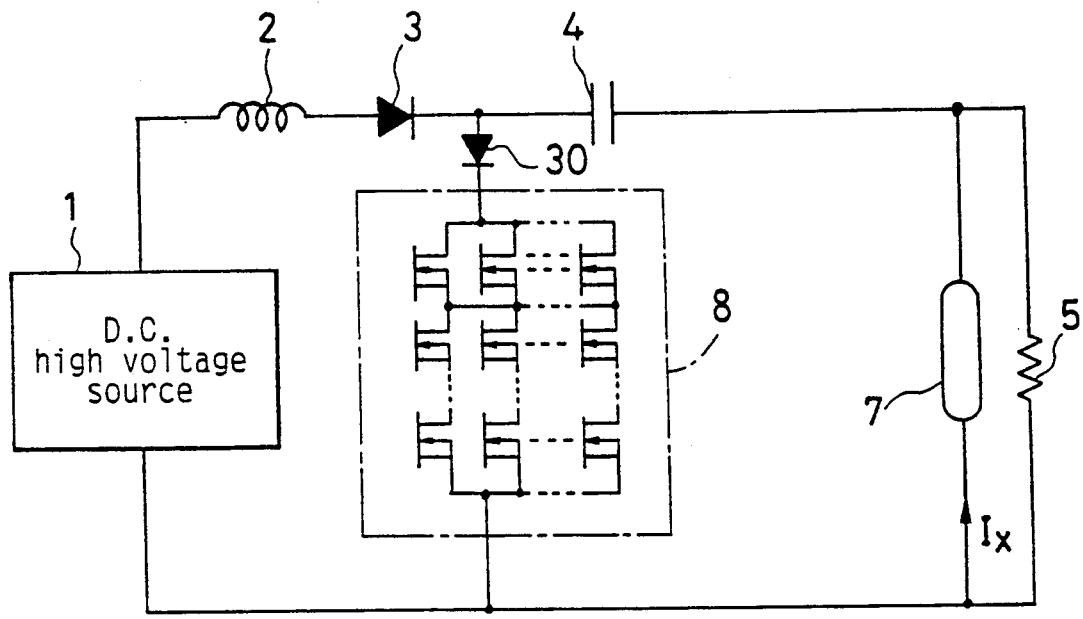
FIG. 15 is a circuit diagram showing the pulse generator circuit of a fourth embodiment of the present invention.

FIG. 15 is a circuit diagram showing a pulse generator circuit of a fourth embodiment. Corresponding parts and components to the first embodiment (FIG. 3) of the pulse generator circuit are shown by the same numerals and marks, and the description thereon made in the first embodiment similarly applies. A difference and feature of this fourth embodiment from the first embodiment is as follows. In this embodiment, the diode 30 for preventing the vibration is inserted between the synthetic semiconductor switch 8 and a connection point of the diode 3 and the capacitor 4. According to this circuit, the bypass resistor 31 such as shown in FIG. 10 is not necessary. The circuit is thereby simplified without spoiling the vibration-prevention effect.

Figure 16:
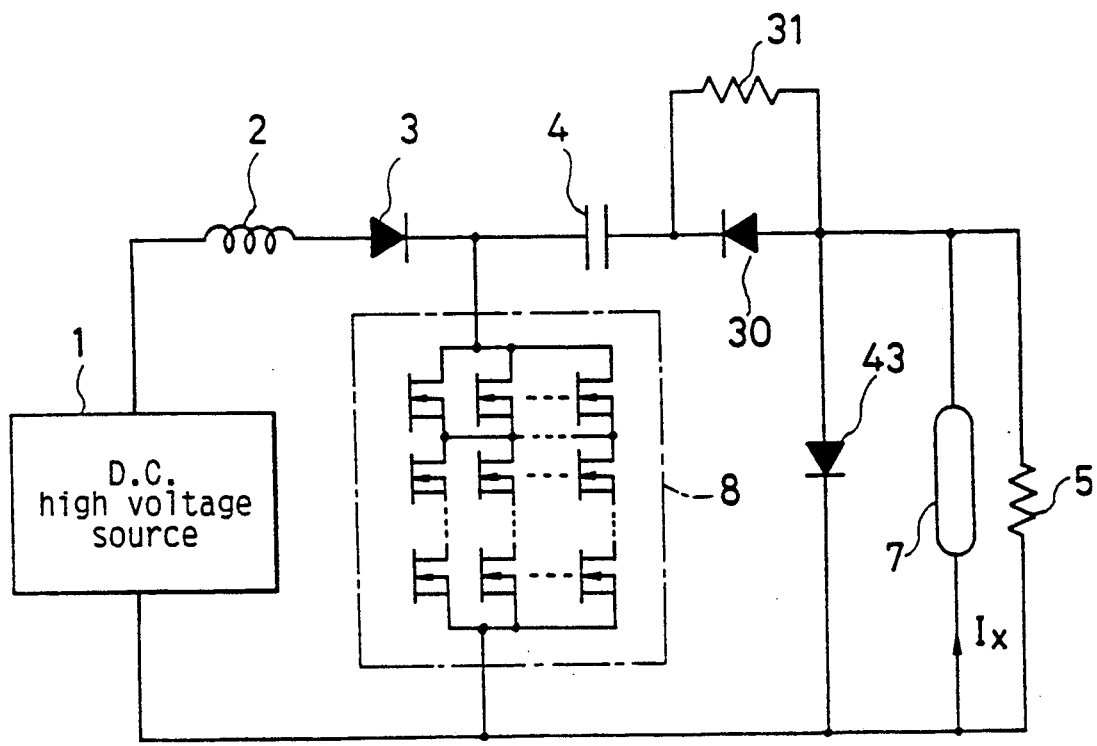
FIG. 16 is a circuit diagram showing the pulse generator circuit of a fifth embodiment of the present invention.
Figure 17:
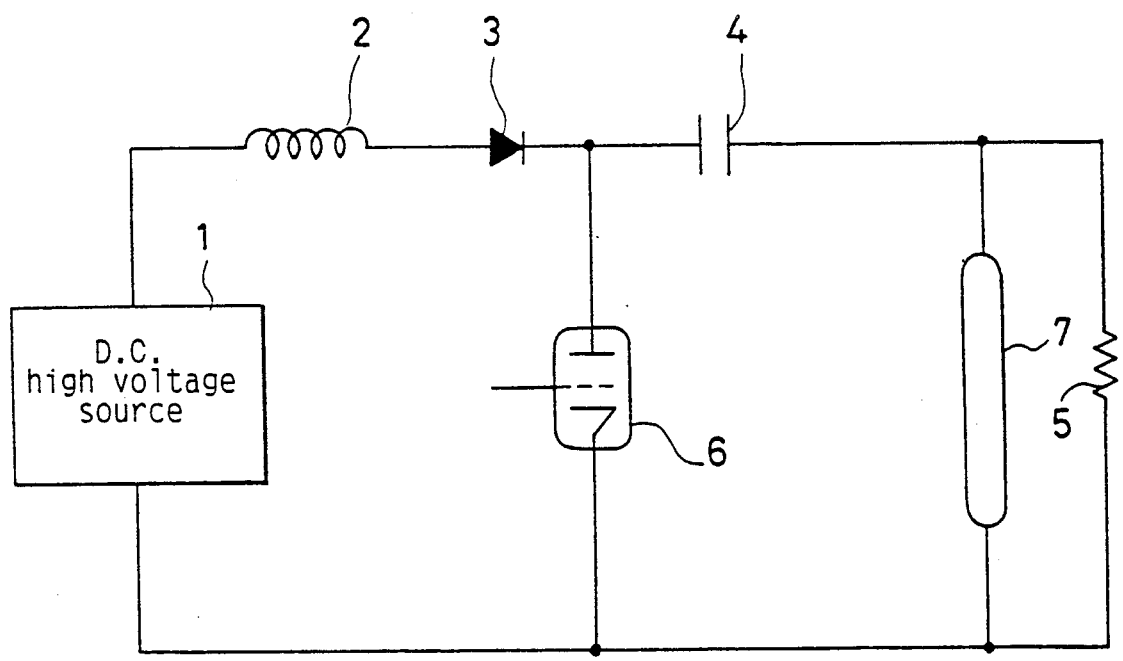
FIG. 17 is the circuit diagram showing the conventional pulse generator circuit.

FIG. 16 is a circuit diagram showing a pulse generator circuit of a fifth embodiment. Corresponding parts and components to the second embodiment (FIG. 10) are shown by the same numerals and marks, and the description thereon made in the second embodiment similarly applies. A difference and feature of this fifth embodiment from the second embodiment is as follows. In this embodiment, a diode 43 is connected in parallel with the laser tube 7. Since polarity of this diode 43 is in reverse to that of the discharge current flowing in the laser tube 7, all the reverse current flows through the diode 43 and rapidly becomes zero through consumption of energy by the resistor 31. Unnecessary temperature-rise of the copper vapor, which is caused by the reverse current, is thereby prevented, and also an efficiency of the laser oscillation is improved.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor switching apparatus comprising:
   a first tube;
   a first plurality of semiconductor switches electrically connected in series and mounted on said first tube;
   at least one second plurality of semiconductor switches electrically connected in series and mounted on said first tube, said at least one second plurality of semiconductor switches being further connected in parallel to said first plurality of semiconductor switches to hereby form a grid of semiconductor switches;
   a second tube in substantially coaxial arrangement with said first tube and being electrically connected to a first end of the series-connection of said first and at least one second plurality of semiconductor switches, said second tube being of a conductive material.

2. A semiconductor switching apparatus in accordance with claim 1, further comprising:
   a first support ring which is provided on a first end part of said first tube and which is electrically connected to a second end of said series-connection of the first and at least one second plurality of semiconductor switches;
   a second support ring which is provided on said first end part of the first tube with a predetermined space held from said first support ring; and
   a plurality of capacitors which are held by said first support ring and said second support ring in said space and which are electrically connected in parallel with one another.

3. A semiconductor switching apparatus in accordance with claim 1, wherein:

said second tube is disposed inside of said first tube.

4. A semiconductor switching apparatus in accordance with claim 1, wherein:

said second tube is disposed outside of said first tube.

5. A semiconductor switching apparatus in accordance with claim 1, wherein each semiconductor switch of said first and at least one second plurality of semiconductor switches is a field effect transistor.

* * * * *